United States Patent [19]

Soojian

[11] 4,255,706
[45] Mar. 10, 1981

[54] BROADBAND VOLTMETER

[75] Inventor: Haig Soojian, Upper Saddle River, N.J.

[73] Assignee: Ballantine Laboratories, Inc., Boonton, N.J.

[21] Appl. No.: 926,507

[22] Filed: Jul. 20, 1978

[51] Int. Cl.³ .................... G01R 15/10; G01R 15/08
[52] U.S. Cl. .................................. 324/132; 324/115; 324/119; 328/144; 364/573
[58] Field of Search ............... 324/132, 115, 119, 95; 328/144; 364/573, 852, 854; 358/32, 164

[56] References Cited

U.S. PATENT DOCUMENTS

| 3,652,934 | 3/1972 | Paljug et al. | 324/132 |
| 3,657,649 | 4/1972 | Odorici | 324/115 |
| 3,752,905 | 8/1973 | Schneider | 358/164 |

OTHER PUBLICATIONS

Schematic of Ballantine Model 340 RF Millivoltmeter; Ballantine Laboratories, Inc.; Boonton, N.J.

Schematic of Boonton Model 92 A RF Millivoltmeter; Boonton Electronics Corp.
Schematic of Model MV-928A RF Millivoltmeter; Millivac Inst., Schenectady, N.Y.; 3-1969.

Primary Examiner—Ernest F. Karlsen
Attorney, Agent, or Firm—Davis, Hoxie, Faithfull & Hapgood

[57] ABSTRACT

A voltmeter comprising a diode detector, a square root converter and a linear amplifier each connected to receive the diode detector output signal, a resistance network connected to receive the outputs of the square root converter and the linear amplifier, means for selectively switching the resistances of the resistance network to change the proportion at the resistance network output between the signal from the square root converter and the signal from the linear amplifier to inversely match the response curve of the diode detector, and means for displaying the amplitude value of the resistance network output signal.

12 Claims, 7 Drawing Figures

BROADBAND VOLTMETER

I have invented an improved meter circuit which is particularly useful for measuring radio frequency signals over a broad bandwidth in the millivolt ranges. Semiconductor diode detectors, especially germanium point contact diode detectors, are the most useful means for converting broad-band radio frequency signals to direct current for measurement. This detection usually takes place in a meter probe. Several types of such detection circuits are known. The output of the detector diodes, however, is a non-linear function of signal amplitude. For a typical RF diode detector of the type used in RF millivoltmeters, a square law response or transfer function is obtained for signals below approximately 30 millivolts (mV), a linear response or transfer function is obtained above approximately 300 mV, and the response between approximately 30 and 300 mV is in transition between square law and linear. Since this transition region is often an important region for voltage measurement, as are the regions above and below, it is necessary to avoid or compensate for the transition response characteristic as well as to provide the appropriate response in the square law and linear regions.

Two principal techniques have been employed to deal with the low level and transition region response characteristics: (1) preamplification and (2) compensation by multiple successive approximations. Preamplification at first appears to be the ideal solution. By amplifying the signal before detection, the entire detector output can be placed in the linear response region and no further compensation is required. It is well known, however, that for operation at ultra-high frequencies it is impractical to amplify before the detector primarily because the bandwidth of amplifiers is generally more restricted than that of the detectors and also because range switching at high frequencies would be impractical to implement at low cost.

Successive approximation techniques are employed in commercial radio frequency millivoltmeters such as the Boonton Electronics Corp. Model 92A and the Millivac Instruments Model No. MV-928A. For example, the shaping amplifier in the Boonton Model No. 92A, includes five differently biased transistor amplifiers arranged in parallel to provide a piecewise linear approximation to the inverse square law response required for the 1 mV, 3 mV, 10 mV and 30 mV ranges. An additional four transistors are similarly arranged to approximate the required response in the 100 mV range, three more are used for the 300 mV range, two more of the 1 V range, and one for the 3 V range. Since the approximations in each range except the 3 V range include from two to five steps, this type of instrument provides only a rough approximation of the response required to match the diode detector. While the effect of the approximation steps may not be noticeable in such an instrument using an analog type meter, they would be noticeable when a digital meter with 0.1% or better resolution is used. Numerous calibration adjustments are required with such successive approximation type millivoltmeters in order to optimize the match to the detector response.

In a typical RF millivoltmeter made in accordance with my invention, the detector probe output is simply amplified sufficiently to place the detected signal in a predetermined amplitude range. That detected signal is then applied in parallel to the inputs of both a square root response channel and a linear response channel which may include an amplifier. The outputs of the square root response channel and the linear response channel are then combined by a precision resistor network to obtain the optimum match to the diode detector for each 10 dB meter range without any approximation steps within each such a range. My invention is also useful for narrower bandwidth devices where it is desireable to provide a transition between square law and linear function ranges, including meter circuits employing diode detectors preceded by an amplifier.

Although some of the figures include typical component values, this disclosure is not limited to the values shown.

Figure 1:
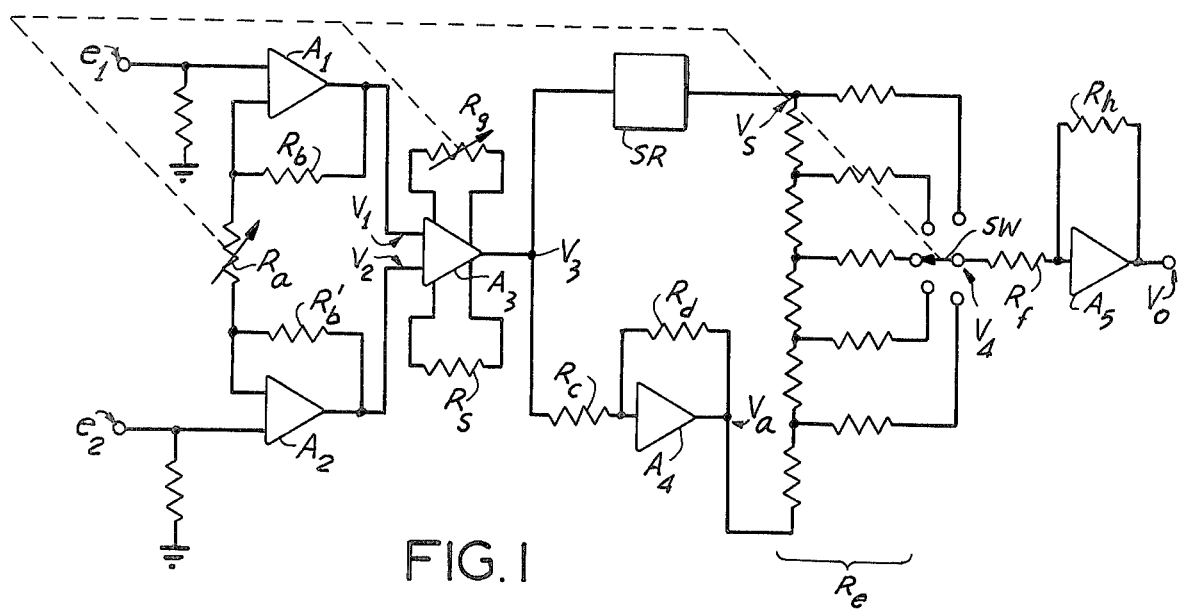
FIG. 1 is an illustrative schematic block diagram used in an explanation of the general nature of my invention.
Figure 2:
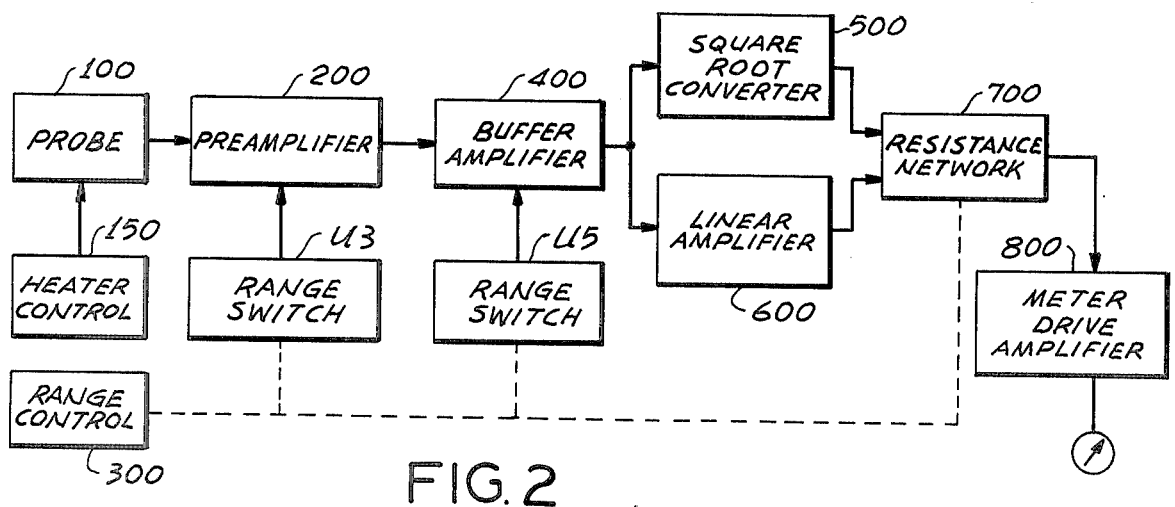
FIG. 2 is a schematic block diagram of an embodiment of my invention.

The general nature of my invention is best explained in connection with FIG. 1 in which $e_1$ and $e_2$ are the input voltages from a detector probe (not shown) to pre-amplifiers $A_1$ and $A_2$ connected as a difference amplifier. The Voltage $V_1$ at the output of amplifier $A_1$ is determined by the formula $$V_1 = \left(1 + \frac{Rb}{Ra}\right) e_1 - \left(\frac{Rb}{Ra}\right) e_2 \qquad (1)$$

and the voltage $V_2$ at the output of amplifier $A_2$ is determined by the formula $$V_2 = \left(1 + \frac{Rb}{Ra}\right) e_2 - \left(\frac{Rb}{Ra}\right) e_1 \qquad (2)$$

where Ra is the value of resistor Ra and Rb is the value of resistors Rb and Rb'. Ra is the adjustable resistance used to adjust the gain of amplifiers A1 & A2. Adjustable resistance Rg is used to adjust the gain of amplifier $A_3$ so that its output voltage $V_3$ is determined by the formula $$V_3 = \frac{Rs}{Rg}(V_1 - V_2) \qquad (3)$$

$$= \frac{Rs}{Rg}\left(1 + \frac{2Rb}{Ra}\right)(e_1 - e_2) \qquad (4)$$

The signal at the output of amplifier $A_3$ is applied to a square root converter SR and to a linear operational amplifier $A_4$. The output voltage Vs of the square root converter is $-\sqrt{10\,V_3}$. The output of the linear operational amplifier $A_4$ is $V_a = -Rd/Rc$.

The resistor network $R_e$ determines the proportions of Vs and $V_a$ as components of $V_4$. Where k is the mixing factor determined by a given position of the range select switch SW, $$V_4 = -k\sqrt{10V_3} - (1-k)\frac{Rd}{Rc} \quad (5)$$

As a result, the output voltage $V_o$ of the meter drive amplifier can be defined as follows:

$$V_o = -\frac{Rh}{Rf} V_4 \quad (6)$$

$$= \frac{Rh}{Rf}\left(k\sqrt{10V_3} + (1-k)\frac{Rd}{Rc} V_3\right)$$

therefore $$V_o = \frac{Rh}{Rf}\left(k\sqrt{10\frac{Rs}{Rg}\left(1+\frac{2Rb}{Ra}\right)(e_1-e_2)} + (1-k)\frac{RdRs}{RcRg}\left(1+\frac{2Rb}{Ra}\right)(e_1-e_2)\right) \quad (7)$$

Figure 3:
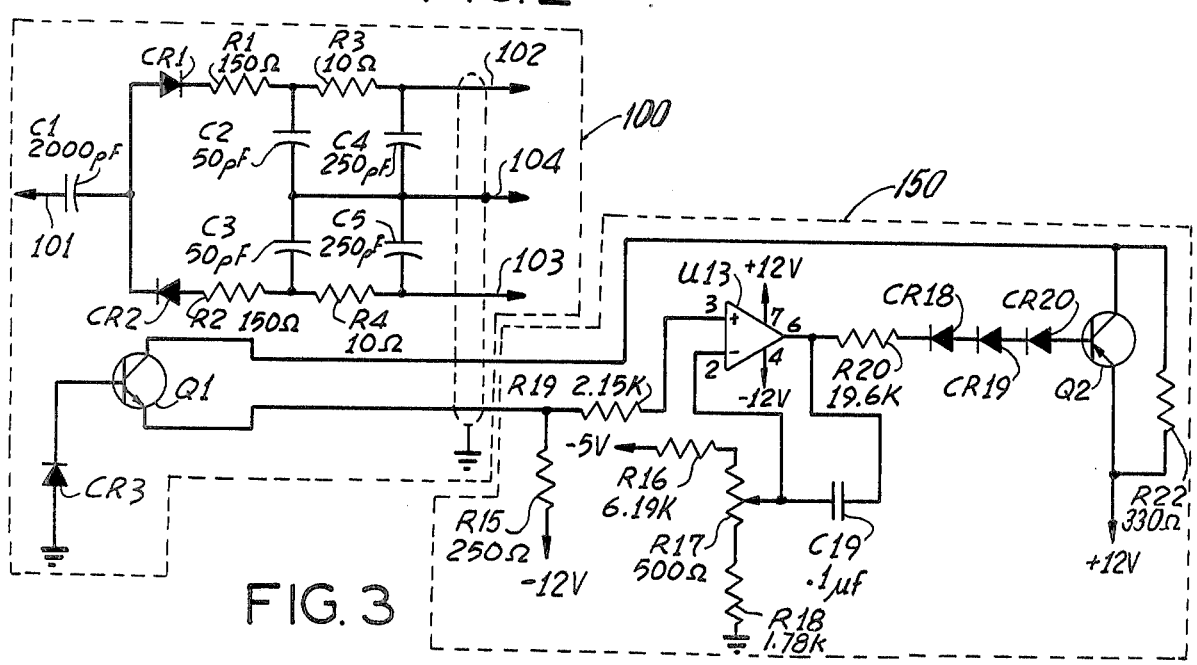
FIG. 3 is a schematic diagram of the probe and probe heater control circuits of the embodiment of FIG. 2.

In the embodiments of FIGS. 2 through 6, the probe 100 converts the alternating current input signal on lead 101 into direct current. As shown in FIG. 3, the probe input is AC coupled by a capacitor C1 to a full wave diode detector formed by detector diodes CR1 & CR2 in a series configuration. The output of the detector is filtered by a filter formed by resistors R1–R4 and capacitors C2–C5. The output DC voltage at leads 102 and 103 is a function of the amplitude of the input signal on lead 101. Lead 104 is a double shield surrounding leads 102 & 103, together forming the probe cable. Lead 104 is connected to the main ground of the millivoltmeter.

The full wave rectification of the detector probe permits measurement of signals having asymmetrical waveforms without error from polarity turn-over effects. The detector operates in the square law region below 30 mV rms input and the instrument provides rms response in this region. As the input signal exceeds 30 mV rms the response gradually approaches peak-to-peak at 100 mV and above. The instrument is calibrated in rms of a sine wave.

The detector diodes CR1 & CR2 in the RF Probe are germanium point contact types to assure low noise and conversion efficiency at low signal levels. They exhibit extremely high back resistance and have very low junction capacity. These characteristics cause the probe to have high input impedance over the very wide frequency range from 10 kHz to beyond 1.2 GHz. The detector diodes CR1 and CR2 should be carefully matched. Resistors R1 & R2 in series with each of the diodes lower a series resonant peak which occurs in the 700 MHz region and flatten the frequency response of the instrument.

The detection efficiency of the detector diodes CR1 & CR2 determines the calibration accuracy of the instrument. Temperature variations will change the detection efficiency and conduction offset so as to affect calibration. A number of techniques can be used to minimize temperature effects. In the Ballantine Model 3440A RF millivoltmeter, which is constructed generally in accordance with the embodiment described here, the probe housing is heavy brass with a double wall, to prevent localized external temperature variations from changing short term calibration by providing a long thermal time constant. The detector diodes CR1 & CR2 are heat shunted by enclosing them in a metal heat sink (not shown) mounted on power transistor Q1, typically a type No. 2N4921. This transistor Q1 is supplied with a constant 40 mA by the probe heater control 150 while the collector voltage of transistor Q1 (and therefore the power dissipation in Q1) is changed to provide relatively stable temperature conditions (typically $\pm 3°$ C.) for the detector diodes CR1 & CR2 over an operating range of 0° C. to 35° C. Transistor Q2 is a grounded emitter power amplifier which is used to vary the collector voltage of Q1.

The ambient temperature inside the probe is sensed by diode CR3 and the base-emitter diode of transistor Q1. Operational amplifier U13 (typically a RCA type No. 3140) compares the voltage across these two temperature sensing junctions with the voltage set by the probe temperature adjustment resistor R17. A change in the ambient temperature of transistor Q1 and diode CR3 (which are in thermal contact with the detector diodes CR1 & CR2) will cause the output of amplifier U13 to drive transistor Q2 in the direction required to adjust the power dissipation in transistor Q1 by an amount sufficient to reestablish the desired temperature. Since amplifier U13 has more than 60 dB of voltage gain, a sensing junction voltage variation of approximately 2 mV per °C. is adequate to control the collector voltage of Q2 and thus control the power dissipated in transistor Q1. Resistor R17 is normally adjusted to provide a detector diode operating ambient temperature of 35° to 40° C. This temperature may be increased if the probe is actively used above 45° C.

Figure 4:
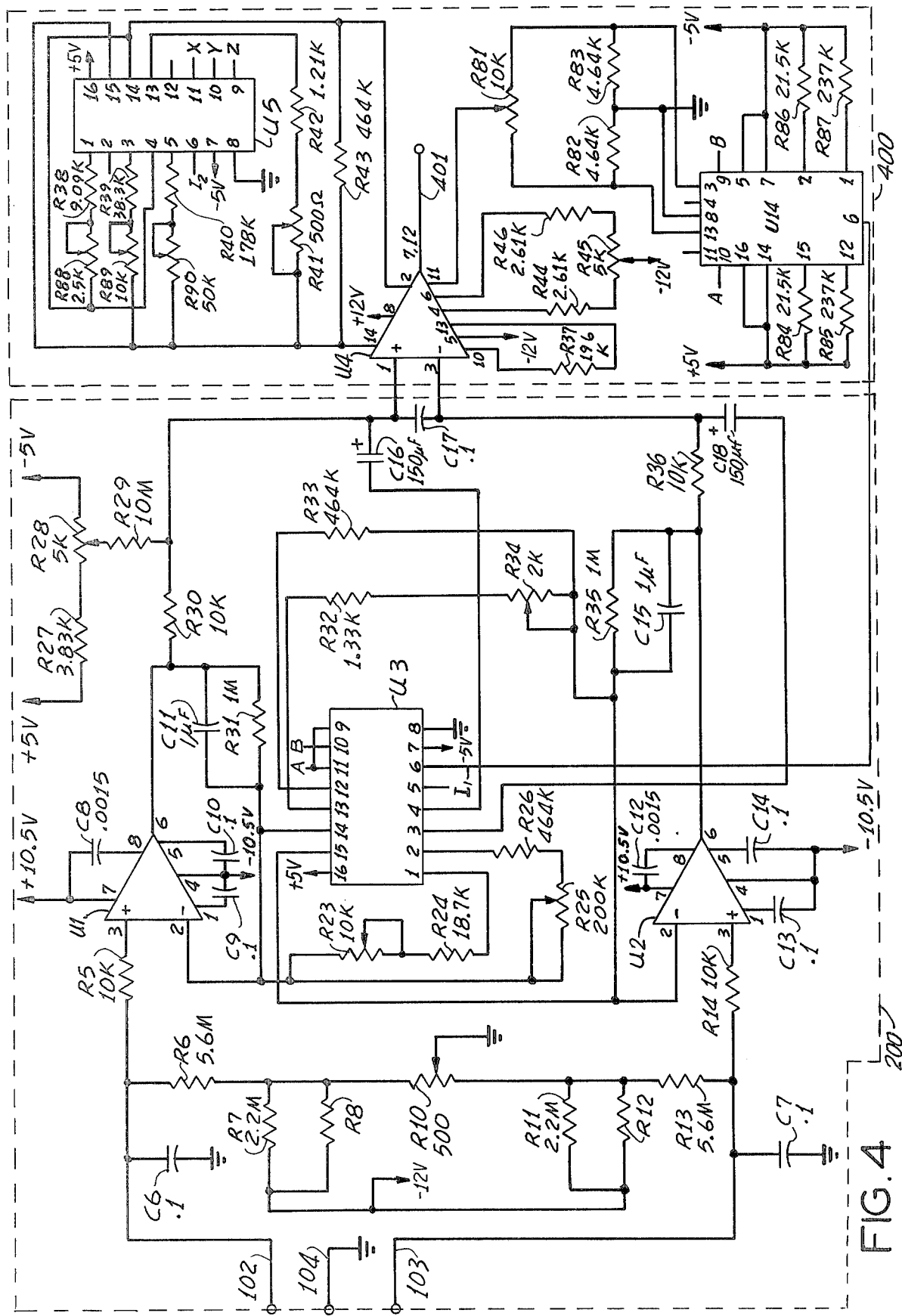
FIG. 4 is a schematic diagram of the preamplifier and buffer amplifier of the embodiment of FIG. 2.

The input amplifier 200, shown in detail in FIG. 4, uses monolithic integrated circuit chopper stabilized operational amplifiers U1 & U2. To avoid the necessity of carefully matching the operational amplifier input characteristics, the values of resistors R8 and R12 are selected to provide balanced input characteristics. The differential outputs on the leads 102 & 103 from the RF Probe 100 are each applied to input terminal 3 of preamplifiers U1 and U2 (typically Texas Instrument type No. TL089C's) which are connected in an instrumentation amplifier configuration with very high common mode rejection. Additional rejection of unwanted low frequency signals, power line frequency noise and low frequency amplifier noise is provided by feedback capacitors C11 & C15 and filter capacitors C6 & C7.

Thermal effects, input offset voltages and currents which would affect the meter's zero point are balanced out by biasing the inputs of U1 and U2. Resistors R10 and R81 (in the buffer amplifier circuit 400) are used for meter zero adjustment. Adjustment of resistor R10 is only required at long intervals and when amplifier and probe components are replaced.

Range switching in this embodiment of my invention is accomplished electronically by use of field effect transistor (FET) switches. The FET switches U3, U5, U8 & U14, which are discussed below in connection with their associated circuits, are controlled by range control circuit 300 shown in FIG. 5A. Electronic switching is used to avoid mechanical switching in the high gain amplifiers and to permit remote programming.

Figures 5A, 5B:
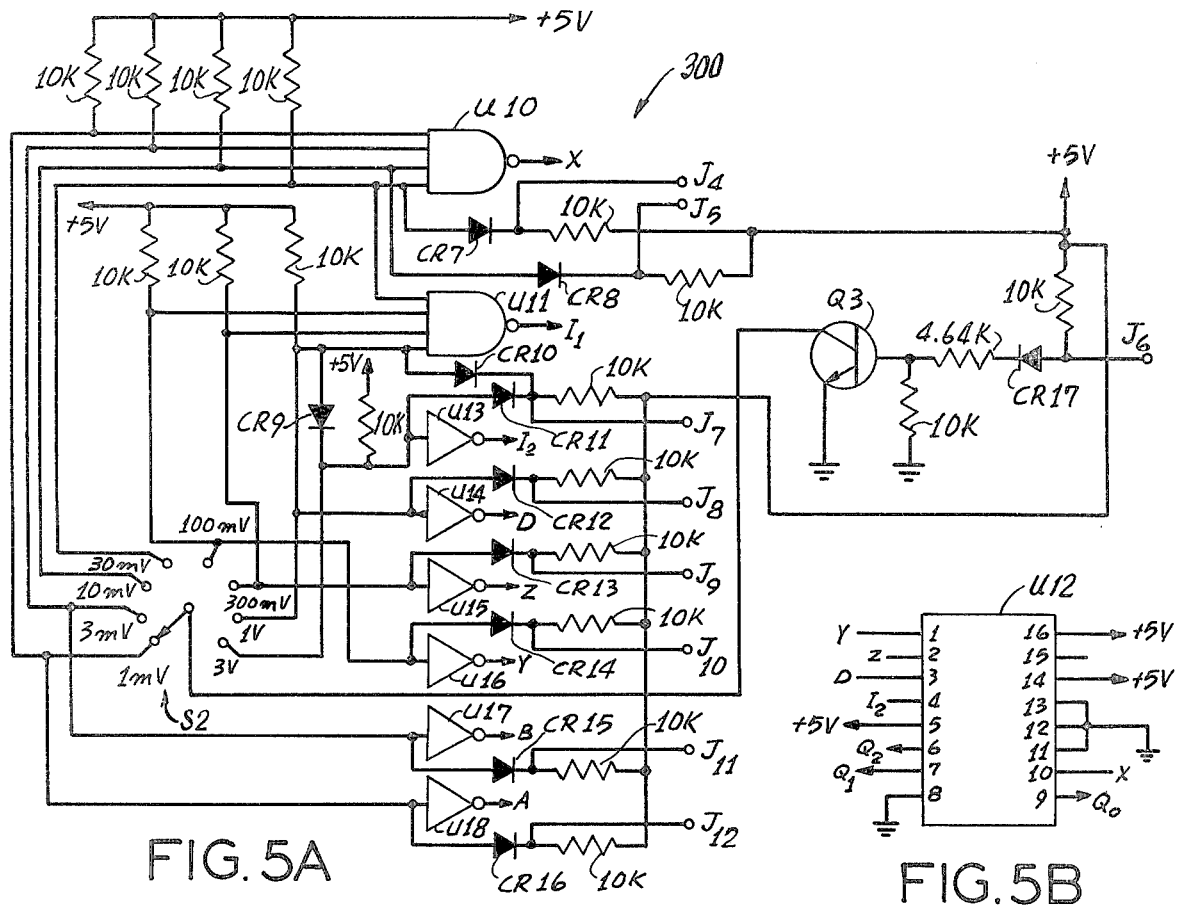
FIG. 5A is a schematic diagram of the range control circuit of the embodiment of FIG. 2.
FIG. 5B is a schematic diagram of a three bit binary encoder used with the range control circuit of FIG. 5A.

An eight-position range control switch S2, shown in FIG. 5A, controls the input to AND gates U10 & U11 and inverters U13–U18, which provide switching control outputs $A, B, D, X, Y, Z, I_1$ and $I_2$. The information from control outputs $D, X, Y, Z,$ and $I_2$ is placed in three bit binary form on lines $Q_0$, $Q_1$ and $Q_2$ by an encoder U12 (such as Motorola type No. MC 14532), shown in FIG. 5B, for use by the FET switch U8 in the precision resistor network 700 shown in FIG. 6. The outputs of the range control circuit 300 and the encoder U12 for the various ranges, together with the resulting connections made by the controlled FET switches U3, U5, U8 & U14 are shown in Table 1 below:

TABLE 1

| Range | Range Control Outputs | | | | | | | | Binary Code | | | U3 Pin Conns. | U5 Pin Conns. | U8 Pin Conns. | U14 Pin Conns. |
|---|---|---|---|---|---|---|---|---|---|---|---|---|---|---|---|
|  | A | B | D | X | Y | Z | $I_1$ | $I_2$ | $Q_1$ | $Q_2$ | $Q_3$ |  |  |  |  |
| 1 mV | 1 | 0 | 0 | 1 | 0 | 0 | 0 | 0 | 0 | 0 | 0 | 4 to 3, 2 to 15, 13 to 14 | 4 to 5, 2 to 15, 13 to 14 | 3 to 13 | 13 to 14, 3 to 5 |
| 3 mV | 0 | 1 | 0 | 1 | 0 | 0 | 0 | 0 | 0 | 0 | 0 | 4 to 5, 1 to 15, 12 to 14 | 4 to 5, 2 to 15, 13 to 14 | 3 to 13 | 13 to 15, 3 to 2 |
| 10 mV | 0 | 0 | 0 | 1 | 0 | 0 | 0 | 0 | 0 | 0 | 0 | 4 to 5, 1 to 15, 13 to 14 | 4 to 5, 2 to 15, 13 to 14 | 3 to 13 | 13 to 12, 3 to 1 |
| 30 mV | 0 | 0 | 0 | 1 | 0 | 0 | 1 | 0 | 0 | 0 | 0 | All Open | 4 to 5, 2 to 15, 13 to 14 | 3 to 13 | All Open |
| 100 mV |  |  | 0 | 0 | 1 | 0 |  | 0 | 0 | 0 | 1 | All Open | 4 to 5, 1 to 15, 12 to 14 | 3 to 1 | All Open |
| 300 mV |  |  | 0 | 0 | 0 | 1 |  | 0 | 1 | 0 | 1 | All Open | 3 to 5, 2 to 15, 12 to 14 | 3 to 5 | All Open |
| 1 V |  | 1 | 0 | 0 | 0 |  |  | 0 | 0 | 1 | 1 | All Open | 4 to 5, 2 to 15, 12 to 14 | 3 to 2 | All Open |
| 3 V |  | 0 | 0 | 0 | 0 |  | 1 | 1 | 1 | 1 |   | All Open | All Open | 3 to 4 | All Open |

Connector pins J4–J12 are made available for remote programming control of the range control 300. When remote programming is employed, the manual range control switch S2 is disabled by a signal applied to pin J6.

The open loop again of each of the preamplifiers U1 & U2, shown in FIG. 4, is over 100 dB. Gain in the preamplifier is controlled by varying the resistance between the feedback input terminals 2 of amplifiers U1 & U2. The three-pole double-throw FET switch U3 (typically a RCA type No. CD 4053) is used to connect the appropriate resistor group R32 & R34, R23 & R24, R25 & R26 or R33 between the preamplifiers U2 & U3, to establish the appropriate range. Table 1 shows the connections established by the FET switch U3 in response to logic signals on its input terminals 6, 10 and 11. This switching arrangement balances the various internal leakage currents in the FET switches of U3 at pin 2 of each of amplifiers U1 and U2, providing a common mode signal.

When the millivoltmeter is used on the 1 mV range, additional damping and low frequency noise filtering is provided by the circuit including capacities C16 and 18. Capacitor C17 provides damping on all ranges.

Buffer amplifier circuit 400, also shown in FIG. 4, employs a monolithic instrumentation amplifier U4 (typically an Analog Devices type No. AD521) to convert the differential signal from preamplifiers U1 & U2 to a single-ended signal on lead 401. The gain of amplifier U4 is set by the ratio of the fixed resistor R37 connected between terminals 10 and 13 and the resistance coupled between terminals 14 and 2 which is varied by the operation of a three-pole double throw switch U5 (typically a RCA type No. 4053). Resistor R28 in the preamplifier 200 is adjusted to compensate for input offset errors to amplifier U4 by setting its output to zero on the 30 mV Range. Resistor R45 is the zero adjust for offset compensation on the 3 Volt range, where amplifier U4 has the least gain. The truth table for FET switch U5 is given in Table 1 above. The full scale output voltage of amplifier U4 is maintained at approximately +3.6 Volts for all ranges.

Front panel meter zeroing is accomplished by adjustment of a ten-turn potentiometer R81 which provides an output reference for amplifier U4. Since the amplitude of the zero correction signal varies as a function of the selected range, in dependence on the changes in gain of the preamplifier 200, the amplitude of the signal from potentiometer R81 is scaled as a function of the selected range for the 30 mV and lower ranges.

The two pole, four position switch U14 is controlled by two logic signals A and B from the range control 300. The connections made by switch U14 are given in Table 1 above. In the embodiment shown here, on the 1 mV range, potentiometer R81 can provide an output reference voltage to pin 11 of amplifier U4 in the range of −5 V to +5 V. In the 3 mV range, the reference is reduced by a voltage divider comprising resistors R82, R83, R84 and R86, to correspond to the reduction in gain of the preamplifier 200. In the 10 mV range, a further reduction is provided by substituting resistors R85 and R87 for resistors R84 and R86 in the voltage divider. In the 30 mV and higher ranges, the input circuit offset has no effect on meter zeroing, and R81 is disconnected from its ±5 V power source by a signal on the inhibit line I, connected to pin 6 of the switch U14.

Figure 6:
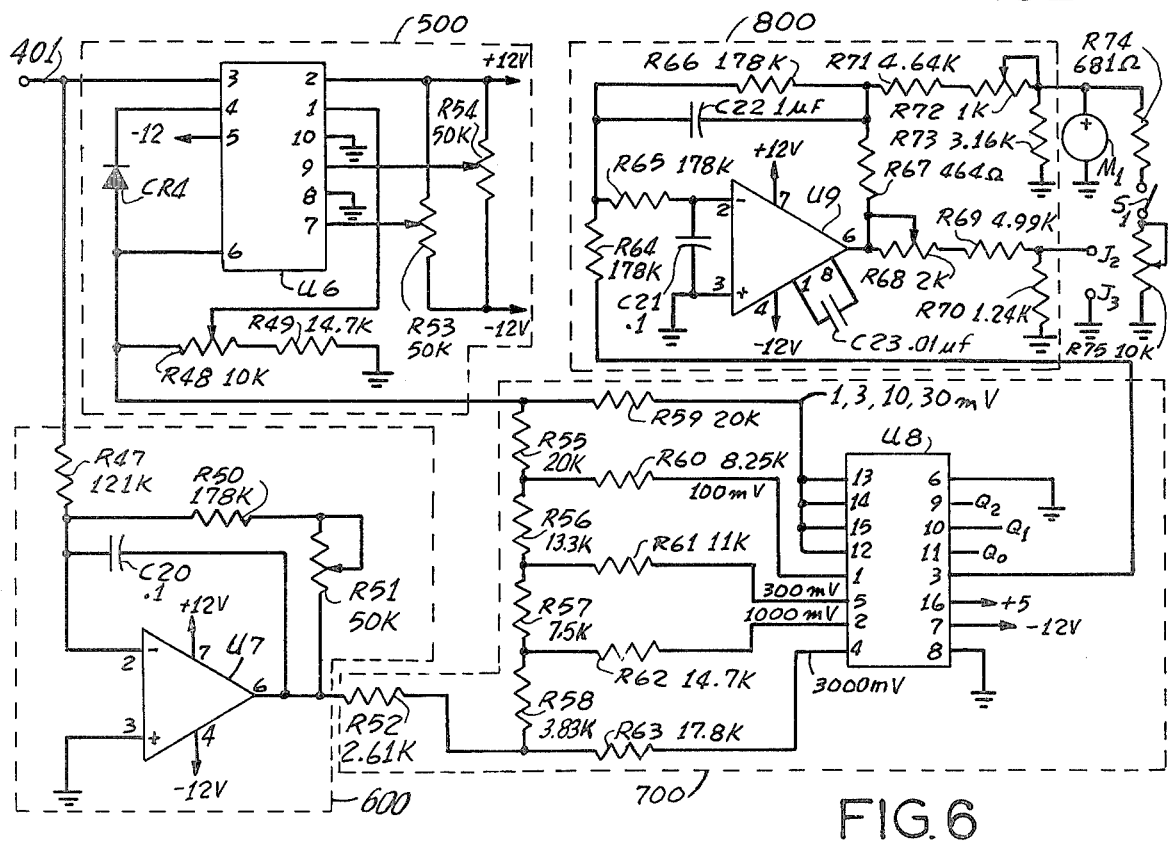
FIG. 6 is a schematic diagram of the square root converter, linear amplifier, resistance network and meter drive circuit of the embodiment of FIG. 2.

The voltmeter matches the characteristics of the probe by processing the signal on lead 401, which is representative of the probe output, in a square root converter circuit 500 and a linear amplifier 600 having inputs in parallel, and then mixing their outputs in various proportions as is appropriate for each voltage range by use of the precision resistance network 700. This portion of the circuit is shown in FIG. 6. The probe 100 operates in the square law region for input signals below 30 mV and gradually becomes a linear detector as the input signal increases. The square root converter U6 provides the proper linearization and calibration for the 1 mV through 30 mV Ranges. The output of linear amplifier U7 is added to the proportionately reduced output of square root converter U6 to uniformly and precisely follow the input detector diode curve as it changes from square law to linear detection for ranges above 30 mV.

A root-mean-square (rms) response in the small signal region below 30 mv may be obtained by taking the square root of the sum of the squared signal components.

$$V_{rms} = V_1^2 + V_2^2 + V_3^2 \ldots V_x^2$$

A monolithic square root converter U6 (typically a Analog Devices type No. AD533) is used to precisely follow a square root response with the transfer function.

$$V_o = -\sqrt{10 V_{in}}$$

As a result of the +3.6 Volt full scale signal input to the square root converter U6 on lead 401, the square root converter U6 will provide a −6 Volt full scale output signal (i.e. $V_o = -\sqrt{10 \times 3.6} = -\sqrt{36} = -6$). The square root converter circuit 500 requires only three adjustments: (a) square root zero is set by potentiometer R54, (b) square root full scale output is set by potentiometer R48, and (c) square root half scale tracking is set by potentiometer R53.

The linear amplifier 600 is an inverting dc amplifier with feedback gain stabilization utilizing a FET input high gain operational amplifier U7 (typically a RCA type No. 3140). Gain is set by potentiometer R51 in combination with resistor R47 and resistor R50. The linear output full scale adjust resistor R51 is set so that +3.6 Volts input to amplifier U7 at full scale provide −6 Volts output.

The precision resistor network 700 comprising resistors R52, R55–R63, plus the feedback network of meter amplifier U9, performs the required scale linearization. Resistors R59–R63 are selected to provide a constant output impedance. The output of resistor network 700 is selected for each of the ranges by the eight position FET Switch U8. The first four steps, for the 1 to 30 mV ranges, are connected together through resistor R59 to provide the inverse of square law response. Table 1 above includes a truth table for FET switch U8. The switched steps of this network are arranged so that the inverse of the probe response is obtained in each range.

The meter drive amplifier 800 employs a FET input DC operational amplifier U9 (typically a RCA type No. 3140) and an active two-pole low-pass filter to reduce meter perturbations. Gain is set at approximately −1 resistors R64 and R66 in conjunction with the resistor network 700. The two-pole low-pass filter is formed by capacitors C21 & C22 and resistors R64 & R65 in conjunction with the amplifier U9. As a result of this filter, the response is down 3 dB at 2 Hz and falls at a rate of 10 dB per octave.

Resistors R71 & R72 convert the output of amplifier U9 to a current source for the meter. Resistor R72 adjusts full scale calibration of the indicating meter. Resistor R74 and relative reference potentiometer R75 shunt the meter and can be used to provide a different calibration to facilitate dB ratio measurements.

The meter drive amplifier 800 also provides a signal for the DC Recorder output at terminals J2 & J3. Potentiometer R68 can be used to adjust the recorder output for one volt full scale open circuit or to normalize the output to the recorder being driven.

In the Ballantine Model 3440A RF millivoltmeter, which is constructed generally in accordance with the embodiment described here, the following semiconductor device types have been used:
CR3: 1N4002
CR4, 9, 18–20: 1N4148
CR7–8: 1N281
Q2: 2N4918
Q3: 2N3904

The identification of specific components, component values and circuit details in this specification are for illustrative purposes only.

I claim:

1. A voltmeter comprising a diode detector, a square root converter and a linear amplifier each connected to receive the diode detector output signal, a resistance network connected to receive the outputs of the square root converter and the linear amplifier, means for selectively switching the resistances of the resistance network to change the proportion at the resistance network output between the signal from the square root converter and the signal from the linear amplifier to inversely match the response curve of the diode detector, and means for displaying the amplitude value of the resistance network output signal.

2. The voltmeter of claim 1 further comprising an adjustable gain input amplifier connected to receive the diode detector output and connected to provide the diode detector signal to the square root converter and to the linear amplifier.

3. The voltmeter of claim 2, further comprising a range control circuit connected to adjust the input amplifier gain and to adjust the resistances of the resistance network in synchronism.

4. The apparatus of claim 3 wherein the range control comprises a multiposition range switch, a plurality of data line amplifiers, each having an input connected to a portion of the range switch and each driving a data line, a first electrically controllable switch responsive to signals on a plurality of data lines for adjusting the gain of the input amplifier, and a second electrically controllable switch responsive to signals or a plurality of data lines for adjusting the resistances of the resistance network.

5. The voltmeter of any of claims 2, 3 or 4 wherein the adjustable gain input amplifier comprises a preamplifier stage having a pair of preamplifiers connected in an instrumentation amplifier configuration to receive differential outputs from a pair of diode detectors and a buffer amplifier connected to receive the output of the preamplifier stage.

6. The apparatus of claim 5 wherein the gain switching between the lower ranges is accomplished by changing the feedback of a first amplification stage and the gain switching between the upper ranges is accomplished by changing the feedback in a subsequent amplification stage.

7. The apparatus of any of claims 1 through 4 wherein the diode detector is a germanium point contact diode.

8. The apparatus of any of claims 1 through 4 wherein the diode detector is a pair of germanium point contact diodes in a series configuration.

9. The apparatus of claim 5 wherein the diode detector is a germanium point contact diode.

10. The apparatus of claim 5 wherein the diode detector is a pair of germanium point contact diodes in a series configuration.

11. The apparatus of claim 6 wherein the diode detector is a germanium point contact diode.

12. The apparatus of claim 6 wherein the diode detector is a pair of germanium point contact diodes in a series configuration.

* * * * *

UNITED STATES PATENT AND TRADEMARK OFFICE
CERTIFICATE OF CORRECTION

PATENT NO. : 4,255,706

DATED : March 10, 1981

INVENTOR(S) : Haig Soojian

It is certified that error appears in the above—identified patent and that said Letters Patent is hereby corrected as shown below:

Col. 1, line 51, "of" should be --for--.

Table 1, Col. 6, "U8 Pin" should be above the word "Conns" in the second column from the right.

Col. 5, line 34, "again" should be --gain--.

Col. 7, line 45, insert "by" before "resistors".

Signed and Sealed this

Seventh Day of July 1981

[SEAL]

Attest:

RENE D. TEGTMEYER

Attesting Officer    Acting Commissioner of Patents and Trademarks